United States Patent [19]

Van Doorn

[11] Patent Number: 5,279,913
[45] Date of Patent: Jan. 18, 1994

[54] METHOD OF MANUFACTURING A COLOUR FILTER

[75] Inventor: Cornelis J. Van Doorn, Eindhoven, Netherlands

[73] Assignee: U.S. Philips Corporation, New York, N.Y.

[21] Appl. No.: 816,202

[22] Filed: Jan. 2, 1992

[30] Foreign Application Priority Data

Jan. 21, 1991 [NL] Netherlands .......... 9100095

[51] Int. Cl.$^5$ .............................. G03F 9/00
[52] U.S. Cl. ........................... 430/7; 430/321; 430/325; 430/328
[58] Field of Search ............ 430/7, 320, 321, 325, 430/328, 330

[56] References Cited

FOREIGN PATENT DOCUMENTS 58-207010 12/1983 Japan .
63-298242 12/1988 Japan .
2-294602 5/1990 Japan .

*Primary Examiner*—Marion E. McCamish
*Assistant Examiner*—Kathleen Duda
*Attorney, Agent, or Firm*—Norman N. Spain

[57] ABSTRACT

In a manufacturing process for color filters wet-chemical fixing and cleaning steps, as well as the use of several (toxic) chemicals can be avoided by using a combined fixing and cleaning step with the aid of UV radiation in an ozonic atmosphere.

6 Claims, No Drawings

METHOD OF MANUFACTURING A COLOUR FILTER

BACKGROUND OF THE INVENTION

The invention relates to a method of manufacturing a color filter, in which at least one color pattern is provided in a patterned polymeric material layer, whereafter this layer is fixed. The invention also relates to a color filter manufactured by means of said method, and to a display device and a pick-up device provided with such a color filter.

A method of the type mentioned above is described in Japanese Patent Application No. 58-207010 laid open to public inspection. In the method described in this application a solution of a photosetting polymeric material (for example, gelatin dichromate) is provided on a glass substrate, which solution is subsequently exposed via a pattern so that a cured part is produced. This cured part may be striped or mosaic. After the non-cured part has been removed by means of a suitable solvent, the patterned cured part is coloured with one of red, blue, green, yellow, cyan or magenta dyes. The colored part is then fixed successively in tannic acid and antimony potassium tartrate.

If the color filter has several colours, this series of treatments must be repeated several times including the intermediate cleaning steps which are not mentioned. Another drawback of the method is the use of toxic chemicals such as said antimony potassium tartrate. Moreover, the chemicals used have a limited storage life so that the fixing quality deteriorates rapidly.

OBJECTIVES AND SUMMARY OF THE INVENTION

The present invention has, inter alia, for its object to provide a simpler method of manufacturing a color filter. It has also for its object to provide a method in which the use of toxic chemicals can be avoided.

A method according to the invention is therefore characterized in that fixing is effected with the aid of ultraviolet radiation in an ozonic atmosphere.

Dependent on the thickness of the layer to be fixed, the radiation used (wavelength, intensity) and the exposure period, a satisfactory fixation of the resin layer can thus be obtained. Since the fixing and cleaning operations partially coincide, this method requires considerably fewer steps than the known method. Moreover, the color filters are now entirely manufactured by way of a dry-chemical process and the use of tannic acid and antimony potassium tartrate is no longer necessary, which is a logistic advantage.

When manufacturing a multi-color pattern, a plurality of colour patterns is provided in different patterned resin layers and each color pattern is fixed after it has been provided.

Fixing is effected preferably for 1-20 minutes.

The ultraviolet radiation preferably has wavelengths between 150 and 300 nm and an intensity of between 5 and 20 $mW/cm^2$ at a distance of 1-5 cm from the substrate.

For example, glass or quartz may be used as a substrate, for example, when the color filter is used in an electro-optical display device such as a liquid crystal display device. For this substrate it is also possible to choose, for example, silicon or another semiconductor material, as in the case of reflective liquid crystal display devices or pick-up devices such as CCDs, BBDs or other sensors. The colour filter can also be provided on the color-sensitive part of a camera tube.

These and other aspects of the invention will now be described in greater detail with reference to some embodiments.

DESCRIPTION OF THE PREFERRED EMBODIMENT

A color filter for a liquid crystal display device is manufactured starting from a glass plate. A plurality of filters can be simultaneously manufactured on this plate. The starting material may also be, for example, quartz. After the glass plate has been cleaned in fuming nitric acid, a black matrix is first provided in this embodiment by first vapor-depositing a thin layer of chromium and providing it with the desired pattern by way of a photolithographic process.

The glass plate provided with a black matrix is subsequently cleaned by treating it in an ozonic atmosphere for 2 minutes while simultaneously irradiating it with ultraviolet light. In the present embodiment a source with a substantially parallel beam was used, which emitted wavelengths between 150 and 300 nm (by means of a low-pressure mercury lamp with the main electron transitions at 185 and 254 nm). The intensity was 10 $mW/cm^2$ at a distance of 2.5 cm above the glass plate at a wavelength of 254 nm. More generally, the total exposure period is dependent on the intensity used and the spectral composition of the UV source, as well as on the distance between the glass plate and the source, and on the ozone percentage.

The glass plate is subsequently cleaned in, for example, distilled water after it has been slightly heated, if necessary.

Subsequently the assembly is coated with a colorable acrylate lacquer, for example a solution (10%) of co-polymers in methyl glycol or a gelatin (di)chromate or another suitable colorable polymeric material layer. Said layer is provided, for example, by means of spin-coating and the spin-coating speed may also be dependent on the desired color density of the color to be provided. The layer thus provided is subsequently patterned photolithographically.

The patterned resin layer is subsequently provided with a first color pattern by adding the suitable dyes. Generally, known dyes (acidic, direct and reactive dyes) can be used for this purpose. For this first pattern, for example, a red dye R-24P of the firm of Nihon Kayaku or "red GRL" of the firm of Ciba-Geigy is chosen.

The glass plate with the red color pattern thus obtained is subsequently subjected again to a treatment in an ozonic atmosphere for 7 to 8 minutes. With this treatment it is achieved that the color pattern is fixed and that the substrate is cleaned for providing a subsequent color pattern. A possible explanation is that cross-linkage takes place in the polymeric material layer under the influence of the ultraviolet radiation while oxygen ions or oxygen atoms are simultaneously built in due to the presence of ozone. Like the above-mentioned first cleaning treatment, the duration of this treatment may vary again between approximately 1 and 20 minutes, dependent on wavelength used, energy density, distance, etc.

The assembly is subsequently coated again with a colorable acrylate lacquer which is patterned similarly as described hereinbefore, whereafter the patterned polymeric material layer is provided with a second color pattern, for example green. For example, G-1P of the firm of Nihon Kayaku or "green 3GS" of the firm of Ciba-Geigy is used as a green dye.

The glass plate thus obtained is again subjected to a combined fixing and cleaning treatment as described hereinbefore, after providing of the red pattern, whereafter the assembly is again coated with a colourable acrylate lacquer. A patterned polymeric material layer provided with a third color pattern, in this example blue is obtained again. For example, B-5P of the firm of Nihon Kayaku or "blue 8G" of the firm of Ciba-Geigy is used as a blue dye.

After the blue pattern has also been fixed and cleaned simultaneously, the polymeric material layer provided with a colour pattern thus obtained is coated with a top coat which in the case of liquid crystal display devices protects the red-green-blue colour pattern chemically (against the influence of liquid crystal material) as well as mechanically (against the influence of spacers).

Since, as described above, fixing is effected during the cleaning treatment, namely in a completely different way than described in the Japanese Patent Application No. 58-207010 laid open to public inspection, the use of toxic antimony potassium tartrate can be avoided. Also tannic acid is no longer used so that antimony potassium tartrate and tannic acid need not be stored. In addition to a shorter process, the method according to the invention thus also has a logistic advantage. The latter is all the more true because said chemicals have a limited storage life and must be regularly tested for their usability.

The invention is of course not limited to the example described, but other substrates such as, for example, a silicon substrate in which a photosensitive sensor such as a CCD or a BBD is integrated may also be chosen, while color filters in, for example, camera tubes may also be considered. Other composite color may also be chosen such as, for example, cyan, yellow and magenta, while the black mask may be omitted, if necessary.

I claim:

1. A method of manufacturing a color pattern for a color filter, said method consisting of forming a patterned layer of a colorable polymeric material on a substrate, applying a dye to said patterned layer to thereby form a color pattern and then exposing said layer with the color pattern thus obtained to ultraviolet radiation, while the layer is in an ozone atmosphere, to thereby fix the color pattern.

2. A method as claimed in claim 1, characterized in that a plurality of color patterns is provided in different patterned polymeric material layers and in that each color pattern is fixed after it has been provided.

3. A method as claimed in claim 1, characterized in that fixing is effected for 1–20 minutes.

4. A method as claimed in claim 3, characterized in that the ultraviolet radiation has wavelengths between 150 and 300 nm.

5. A method as claimed in any one of the preceding claims, characterized in that the polymeric material layer comprises an acrylate.

6. A method as claimed in claim 1, characterized in that the color pattern is provided on a substrate of glass, quartz or a semiconductor material.

* * * * *